US009406360B2

(12) United States Patent  (10) Patent No.: US 9,406,360 B2
Song  (45) Date of Patent: Aug. 2, 2016

(54) SEMICONDUCTOR DEVICE AND METHOD FOR OPERATING THE SAME

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/489,120

(22) Filed: Sep. 17, 2014

(65) Prior Publication Data

US 2015/0371692 A1  Dec. 24, 2015

(30) Foreign Application Priority Data

Jun. 18, 2014  (KR) .................. 10-2014-0074182

(51) Int. Cl.
*G11C 7/22*  (2006.01)
*G11C 7/10*  (2006.01)
*G11C 29/02*  (2006.01)

(52) U.S. Cl.
CPC .............. *G11C 7/222* (2013.01); *G11C 7/1087* (2013.01); *G11C 7/1093* (2013.01); *G11C 29/023* (2013.01); *G11C 29/028* (2013.01); *G11C 2207/105* (2013.01); *G11C 2207/2254* (2013.01)

(58) Field of Classification Search
None
See application file for complete search history.

(56) References Cited

U.S. PATENT DOCUMENTS

2007/0277071 A1* 11/2007 Chong ................ G06F 13/4213
714/744
2007/0282555 A1* 12/2007 Chong ............... G01R 31/3191
702/107

FOREIGN PATENT DOCUMENTS

KR  1020090108355  10/2009
KR  1020100136860  12/2010
KR  1020110131765  12/2011

* cited by examiner

*Primary Examiner* — James G Norman
(74) *Attorney, Agent, or Firm* — IP & T Group LLP

(57) ABSTRACT

A semiconductor device may include a first pad suitable for inputting a dock, a plurality of second pads suitable for inputting data through a plurality of first data paths, a third pad suitable for inputting a first strobe signal through a first strobe signal path, a data latch unit suitable for latching the data inputted through the first data paths in response to the first strobe signal inputted through the first strobe signal path, and a calibration control unit suitable for calibrating delay values of the plurality of first data paths and the first strobe signal path in a first calibration mode such that a plurality of first test signals passing through the respective first data paths and a second test signal passing through the first strobe path are in phase with the clock inputted from the first pad.

20 Claims, 8 Drawing Sheets

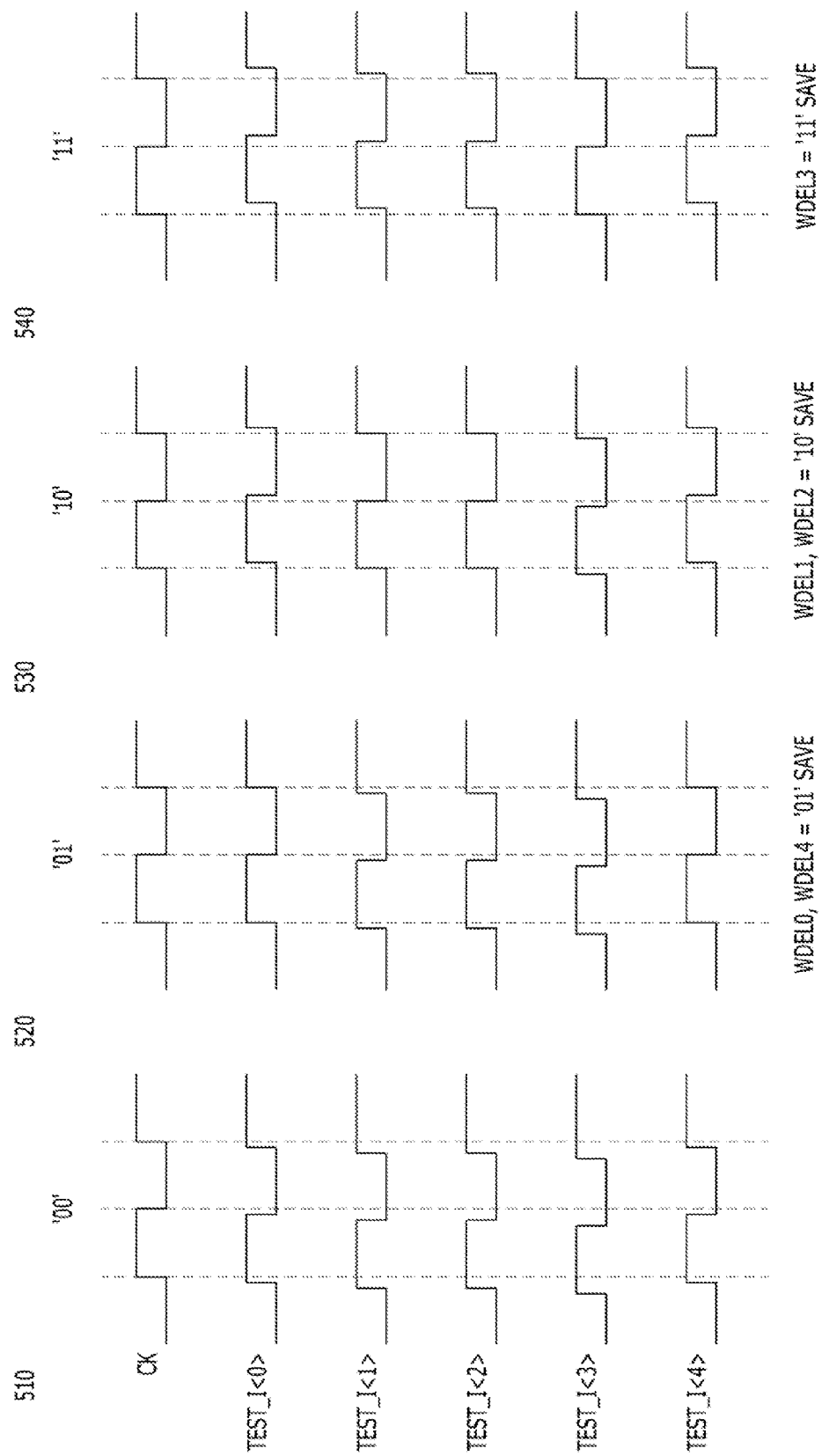

SEMICONDUCTOR DEVICE AND METHOD FOR OPERATING THE SAME

CROSS-REFERENCE TO RELATED APPLICATIONS

The present application claims priority of Korean Patent Application No. 10-2014-0074182, filed on Jun. 18, 2014, which is incorporated herein by reference in its entirety.

BACKGROUND

1. Field

This patent document relates to a semiconductor device and a method for operating the same.

2. Description of the Related Art

FIG. 1 is a configuration diagram of a semiconductor device.

As illustrated in FIG. 1, the semiconductor device includes a clock pad CK, a plurality of data pads DQ<0:N>, a strobe signal pad DQS, a write control unit 110, a read control unit 120, and an internal circuit 130.

During a write operation in which a write command WT is inputted, a clock CK, data DATA0 to DATAN, and a write strobe signal WDQS may also be inputted to the semiconductor device through the clock pad CK, the plurality of data pads DQ<0:N>, and the strobe signal pad DQS, respectively. The write control unit 110 may latch data which are inputted in series through the data pads DQ<0:N> in response to the write strobe signal WDQS, serial-to-parallel convert the latched data in response to the clock CK, and transmit the converted data to the internal circuit 130. The data transmitted to the internal circuit 130 are stored in memory cells (not illustrated in FIG. 1) designated by an address ADD.

During a read operation in which a read command RD is inputted, the clock CK may also be inputted through the clock pad CK. The internal circuit 130 may read data stored in memory cells designated by the address ADD, and transmit the read data to the read control unit 120. The read control unit 120 may parallel-to-serial convert the transmitted data in response to an internal clock ICK, generate a read strobe signal RDQS, and output the converted data and the generated read strobe signal RDQS to the plurality of data pads DQ<0:N> and the strobe signal pad DQS, respectively. The internal clock ICK may be generated by delaying the clock CK by a predetermined delay value.

FIG. 2 is a diagram for explaining a problem which occurs due to a difference in delay value among paths through which the signals DATA0 to DATAN and WDQS pass in the semiconductor device.

In the semiconductor device of FIG. 2, the plurality of data pads DQ<0:N> and the strobe signal pad DQS are positioned at different distances from the write control unit 110 and the read control unit 120. Signals may be transmitted from the pads DQ<0:N> and DQS to the write control unit 110, through different paths WP_DQ<0:N> and WP_DQS, and they may also be transmitted from the read control unit 120 to the pads DQ<0:N> and DQS, through different paths RP_DQ<0:N> and RP_DQS. Therefore, the phases of signals passing through the different paths are delayed by different amounts. For reference, FIG. 1 illustrates an example of an arrangement in which the paths between the pads DQ<0:N> and DQS and the write control unit 110 or the read control unit 120 are different from each other. The components of the semiconductor device may be arranged in a different way.

As illustrated in FIG. 2, although the signals inputted to the respective pads DQ<0:N> and DQS have the same phase (waveform diagram 1) when the semiconductor device writes data, the signals arriving at the write control unit 110 may have a phase difference therebetween (waveform diagram 2). Furthermore, the phase difference may not only occur between the write strobe signal WDQS and the data DATA0 and DATAN, but may also occur between the data DATA0 and DATAN. Even when the semiconductor device reads data, a difference exists in delay value between signal paths. Thus, a phase difference occurs between the signals outputted to the respective pads in a similar manner as illustrated in FIG. 2. Such a phase difference is referred to as a skew, and such a skew between input signals reduces margin for stably inputting/outputting data.

SUMMARY

Various embodiments are directed to a semiconductor device capable of calibrating delay values of input/output paths for various signals thereof to reduce the phase difference between the signals and increase the margin for stably inputting/outputting the signals to improve precision and stability thereof, and a method for operating the same.

Also, various embodiments are directed to a semiconductor device capable of calibrating delay values of input paths and then calibrating delay values of output paths by inputting output signals passing through the output paths when the calibration for the delay values of the input paths is completed, thereby more precisely calibrating the delay values of the output paths inside the semiconductor device, and a method for operating the same.

In an embodiment, a semiconductor device may include a first pad suitable for inputting a clock, a plurality of second pads suitable for inputting data through a plurality of first data paths, a third pad suitable for inputting a first strobe signal through a first strobe signal path, a data latch unit suitable for latching the data inputted through the first data paths in response to the first strobe signal inputted through the first strobe signal path, and a calibration control unit suitable for calibrating delay values of the plurality of first data paths and the first strobe signal path in a first calibration mode such that a plurality of first test signals passing through the respective first data paths and a second test signal passing through the first strobe path are in phase with the dock inputted from the first pad.

In an embodiment, a semiconductor device may include a dock pad suitable for inputting a dock, a plurality of data pads suitable for inputting/outputting data, a strobe signal pad suitable for inputting/outputting a strobe signal, an internal circuit suitable for storing inputted data during a write operation and outputting stored data during a read operation, a write control unit suitable for latching data inputted to the plurality of data pads in response to a first strobe signal inputted to the strobe signal pad, serial-to-parallel converting latched data in response to the clock inputted to the clock pad, and transmitting converted data to the internal circuit as the inputted data, during the write operation, a read control unit suitable for parallel-to-serial converting the stored data outputted from the internal circuit in response to an internal clock, outputting converted data to the outside through the plurality of data pads, generating a second strobe signal, and outputting the second strobe signal to the outside (externally) through the strobe signal pad, during the read operation, and a calibration control unit suitable for calibrating delay values of write paths between the plurality of data pads and the strobe signal pad and the write control unit to have the same delay value in a first calibration mode, and calibrating delay values of read paths between the read control unit and the plurality of data pads and the strobe signal pad to have the same delay value in a second calibration mode.

In an embodiment, a method for operating a semiconductor device may include receiving a clock through a clock pad and receiving a plurality of write test signals through a plurality of data pads and a strobe signal pad, passing the plurality of write test signals through a plurality of write paths, respectively, comparing the phases of the write test signals passing through the respective write paths to the phase of the clock, and calibrating delay values of the write paths. The plurality of write paths may include paths between the plurality of data pads or the strobe signal pad and a data latch unit which latches the data inputted to the plurality of data pads in response to a first strobe signal inputted to the strobe signal pad.

BRIEF DESCRIPTION OF THE DRAWINGS

FIG. 5 is a diagram for explaining a process in which the calibration operation of the semiconductor device of FIG. 3 is performed.

DETAILED DESCRIPTION

Figure 1:
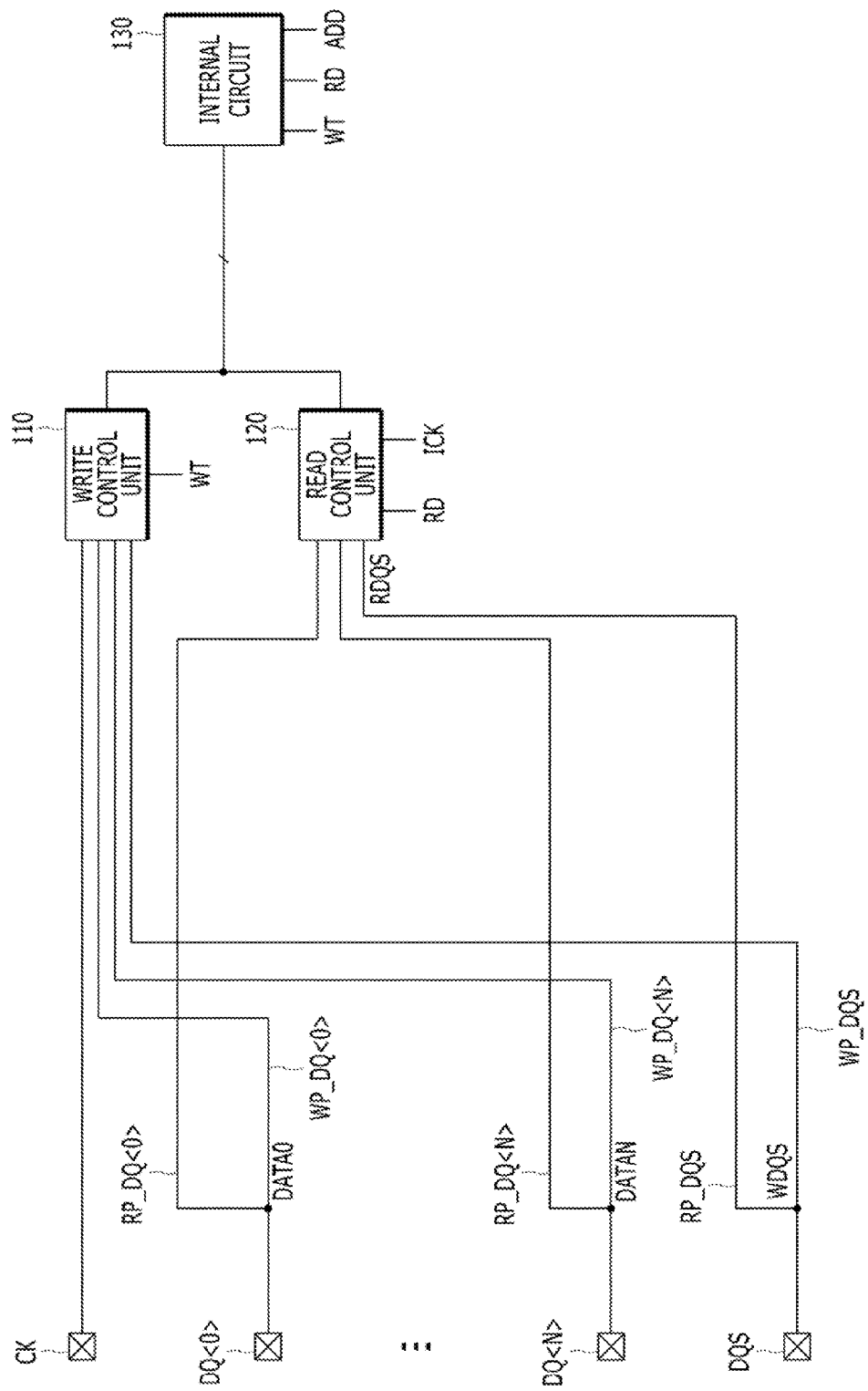
FIG. 1 is a configuration diagram of a semiconductor device.
Figure 2:
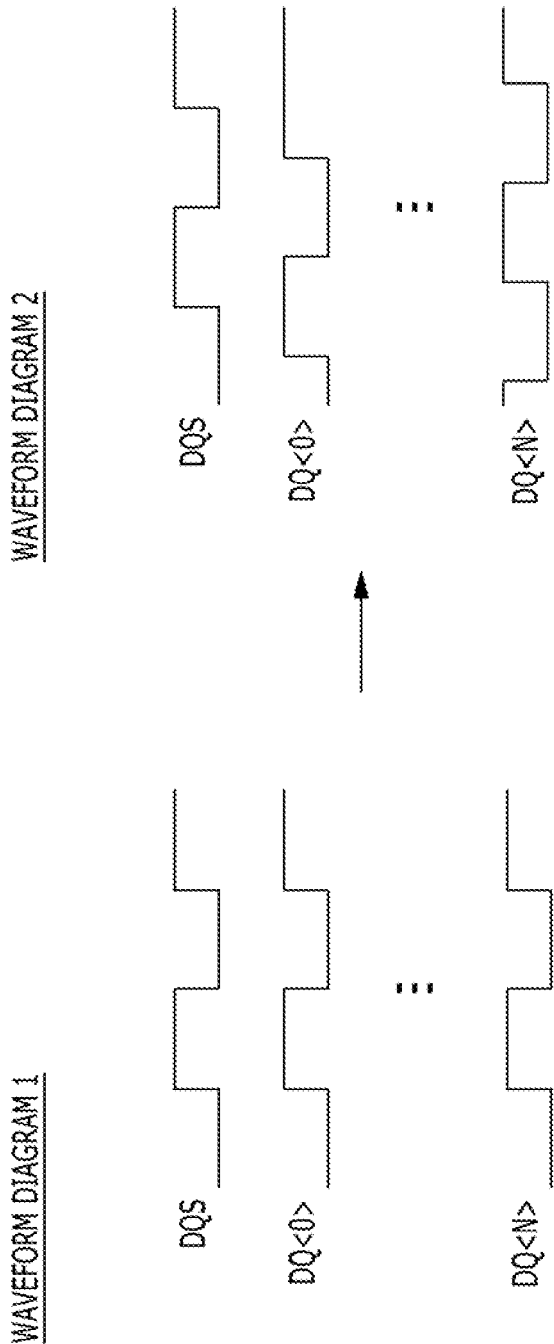
FIG. 2 is a diagram for explaining a problem which occurs due to a difference in delay values among paths through which signals DATA0 to DATAN and WDQS pass in the semiconductor device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the drawings a thickness and length of components are exaggerated compared to actual physical thickness and intervals for convenience of illustration. In the following description, a detailed explanation of known related functions and constitutions may be omitted to avoid unnecessarily obscuring the subject manner of the present invention. Furthermore, 'connected/coupled' represents that one component is directly coupled to another component or indirectly coupled through another component. In this specification, a singular form may include a plural form as long as it is not specifically mentioned. Furthermore, 'include/comprise' or 'including/comprising' used in the specification represents that one or more components, steps, operations, and elements exist or are added.

Figure 3:
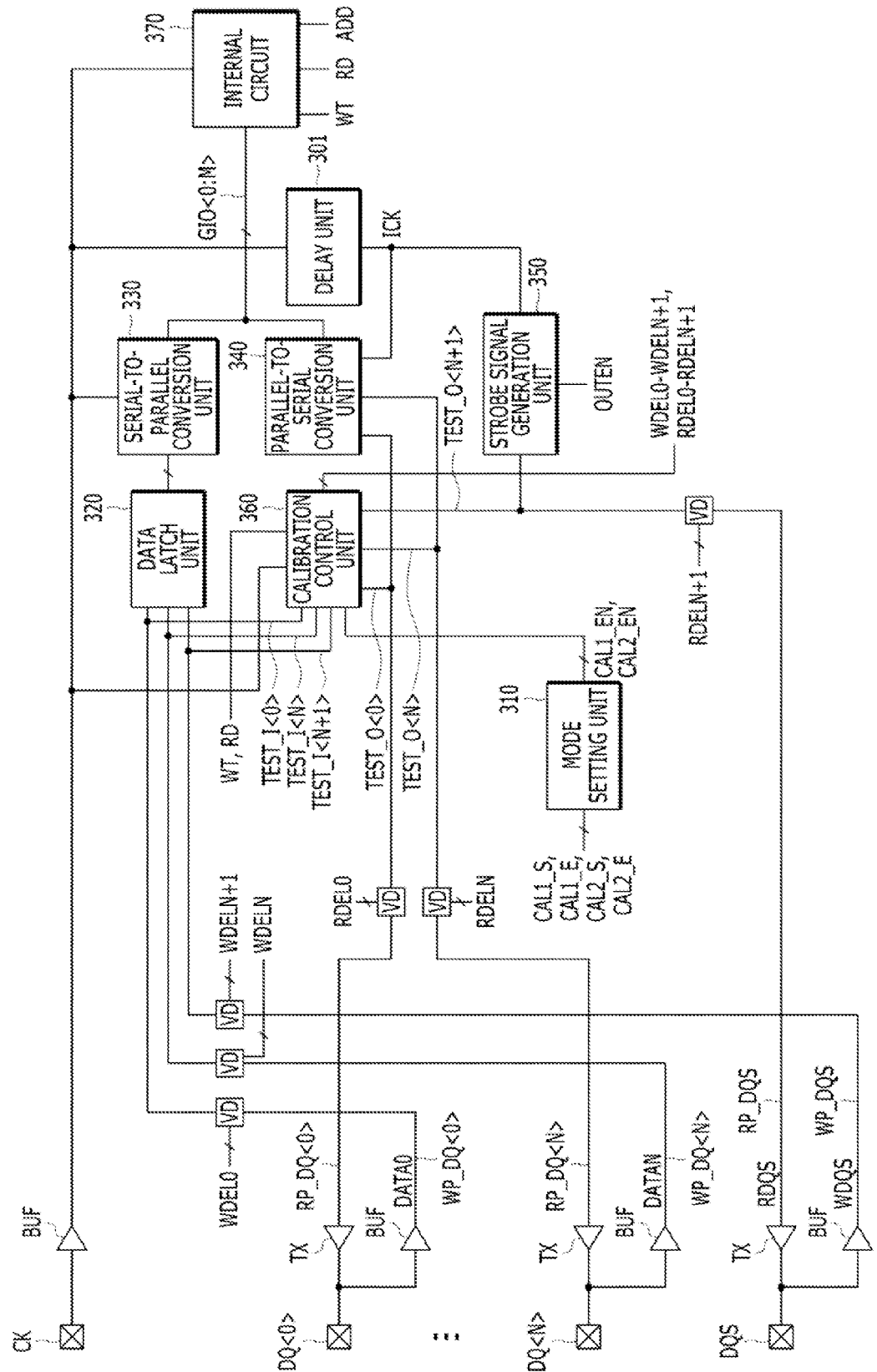
FIG. 3 is a configuration diagram of a semiconductor device in accordance with an embodiment of the present invention.

FIG. 3 is a configuration diagram of a semiconductor device in accordance with an embodiment of the present invention.

As illustrated in FIG. 3, the semiconductor device may include a clock pad CK, a plurality of data pads DQ<0:N>, a strobe signal pad DQS, a plurality of buffers BUF, a plurality of transmitters TX, a mode setting unit 310, a data latch unit 320, a serial-to-parallel conversion unit 330, a parallel-to-serial conversion unit 340, a strobe signal generation unit 350, a plurality of global lines GIO<0:M>, a calibration control unit 360, and an internal circuit 370.

Referring to FIG. 3, the semiconductor device will be described.

A clock CK used for operations of the semiconductor device may be inputted to the clock pad CK. During a write operation, data may be inputted to the semiconductor device through the plurality of data pads DQ<0:N>, and during a read operation, data may be outputted from the semiconductor device through the plurality of data pads DQ<0:N>. During the write operation in which data are inputted, a write strobe signal WDQS may be inputted through the strobe signal pad DQS, and during the read operation in which data are outputted, a read strobe signal RDQS may be outputted through the strobe signal pad DQS.

The plurality of buffers BUF may buffer and output signals inputted through the respective pads CK, DQ<0:N>, and DQS. The plurality of transmitters TX may output input signal to the respective pads CK, DQ<0:N>, and DQS.

The mode setting unit 310 may activate a first calibration signal CAL1_EN when a first calibration start signal CAL1_S is activated, and deactivate the first calibration signal CAL1_EN when a first calibration end signal CAL1_S is activated. Furthermore, the mode setting unit 310 may activate a second calibration signal CAL2_EN when a second calibration start signal CAL2_S is activated, and deactivate the second calibration signal CAL2_EN when a second calibration end signal CAL2_E is activated. When the first calibration signal CAL1_EN is activated, the semiconductor device may enter a first calibration mode, and when the second calibration signal CAL2_En is activated, the semiconductor device may enter a second calibration mode.

The data latch unit 320 may latch data DATA0 to DATAN in response to the write strobe signal DQS, during a write operation. The data latch unit 320 may latch the data DATA0 to DATAN at rising and falling edges of the write strobe signal WDQS. For this operation, the data latch unit 320 may generate a latch signal in phase with the write strobe signal WDQS and a latch signal out of phase with write strobe signal WDQS, and use the latch signals to latch the data DATA0 to DATAN. The data latch unit 320 may transmit the latched data to the serial-to-parallel conversion unit 330.

The serial-to-parallel conversion unit 330 may serial-to-parallel convert the data transmitted from the data latch unit 320 in response to the clock CK, during a write operation. Through the respective data pads DQ<0:N>, a plurality of bits of corresponding data may be sequentially (serially) inputted. The internal circuit 340 of the semiconductor device processes data in parallel, in order to increase processing speed. Thus, the serial-to-parallel conversion unit 330 may arrange the serial input data in parallel, and then output the arranged data.

The parallel-to-serial conversion unit 340 may parallel-to-serial convert output data in response to an internal clock ICK, during a read operation. As described above, the internal circuit 340 processes data in parallel. Thus, in order to output the data arranged in parallel through the corresponding data pads DQ<0:N>, the data need to be arranged in series. The internal clock ICK may include a signal obtained by delaying the clock CK in order to adjust the phase thereof to data outputted during a read operation. The delay unit 301 for generating the internal clock ICK by delaying the clock CK may Include a circuit such as a delay locked loop (DLL).

The strobe signal generation unit 350 may generate a read strobe signal RDQS, which begins to be activated from the time when data are outputted from the semiconductor device, in response to the internal clock ICK, during a read operation. The read strobe signal RDQS may inform external devices of the read timing of data outputted from the semiconductor device. The strobe signal generation unit 350 may generate the read strobe signal RDQS using the internal dock ICK at a period in which an output enable signal OUTEN is activated. The output enable signal OUTEN is activated by delaying the read command RD by read latency, while data corresponding to the read command RD are outputted. The read latency may indicate a waiting time required until the data corresponding to the read command RD are outputted from the semiconductor device after the read command RD is applied to the semiconductor device.

During a write operation, data outputted from the serial-to-parallel conversion unit 330 may be transmitted to the internal circuit 370 through the plurality of global lines GIO<0:M>. Furthermore, during a read operation, data outputted from the internal circuit 370 may be transmitted to the parallel-to-serial conversion unit 340 through the plurality of global lines GIO<0:M>.

The internal circuit 370 may store the data transmitted through the plurality of global lines GIO<0:M> in a place designated by an address ADD in response to a write command WT, during the write operation. Furthermore, the internal circuit 370 may read the data stored in the place designated by the address ADD in response to the read command RD and transmit the read data to the plurality of global lines GIO<0:M>, during the read operation. The internal circuit 370 may include a plurality of memory cells (not illustrated in FIG. 3) to store data, and memory cells of which data are to be accessed (write or read) among the plurality of memory cells may be designated by the address ADD.

The calibration control unit 360 may calibrate delay values of write data paths WP_DQ<0:N> and a write strobe signal path WP_DQS through the first calibration mode, and calibrate delay values of read data paths RP_DQ<0:N> and a read strobe signal path RP_DQS through the second calibration mode. When the first and second calibration modes are completed, the calibration control unit 360 may output delay information WDEL0 to WDELN+1 and RDEL0 to RDELN+1 stored therein.

More specifically, during the first calibration mode, the calibration control unit 360 may compare the phases of test signals TEST_I<0:N+1>, which are inputted through the write paths WP_DQ<0:N> and WP_DQS from the outside of the semiconductor device, to the phase of the clock CK and calibrate the delay values of the write paths WP DQ<0:N> and WP_DQS based on the comparison results, and store the calibrated delay values. Furthermore, during the second calibration mode, the calibration control unit 360 may generate and output test signals TEST_O<0:N+1>. The test signals TEST_O<0:N+1> outputted from the calibration control unit 360 may sequentially pass through the read paths RP_DQ<0:N> and RP_DQS and the write paths WP_DQ<0:N> and WP_DQS, and may be re-inputted to the calibration control unit 360 as test signals TEST_I<0:N+1>. Then, the calibration control unit 360 may compare the phases of the inputted test signals TEST_I<0:N+1> to the phase of the clock CK, calibrate the delay values of the read paths RP_DQ<0:N> and RP_DQS based on the comparison results, and store the calibrated delay values.

The write data paths WP_DQ<0:N> may indicate paths through which data inputted to the respective data pads DQ<0:N> pass to reach the data latch unit 320. The write strobe signal path WP_DQS may indicate a path through which the write strobe signal WDQS inputted to the strobe signal pad DQS passes to reach the data latch unit 320. The read data paths RP_DQ<0:N> may indicate paths through which data outputted from the parallel-to-serial conversion unit 340 pass to reach the respective data pads DQ_<0:N>. The read strobe signal path RP_DQS may indicate a path through which the read strobe signal RDQS generated from the strobe signal generation unit 350 passes to reach the strobe signal pad DQS.

The paths WP_DQ<0:N>, WP_DQS, RP_DQ<0:N>, and RP_DQS may have delay values which are calibrated through the respective pieces of delay information WDEL0 to WDELN+1 and RDEL0 to RDELN+1. For example, each of the delay values may be increased when the value of the corresponding delay information is increased, and decreased when the value of the corresponding delay information is decreased.

For reference, the paths WP_DQ<0:N>, WP_DQS, RP_DQ<0:N> and RP_DQS may include variable delay units VD of which the delay values are calibrated in response to the respective pieces of delay information WDEL0 to WDELN+1 and RDEL0 to RDELN+1.

Figure 4A:
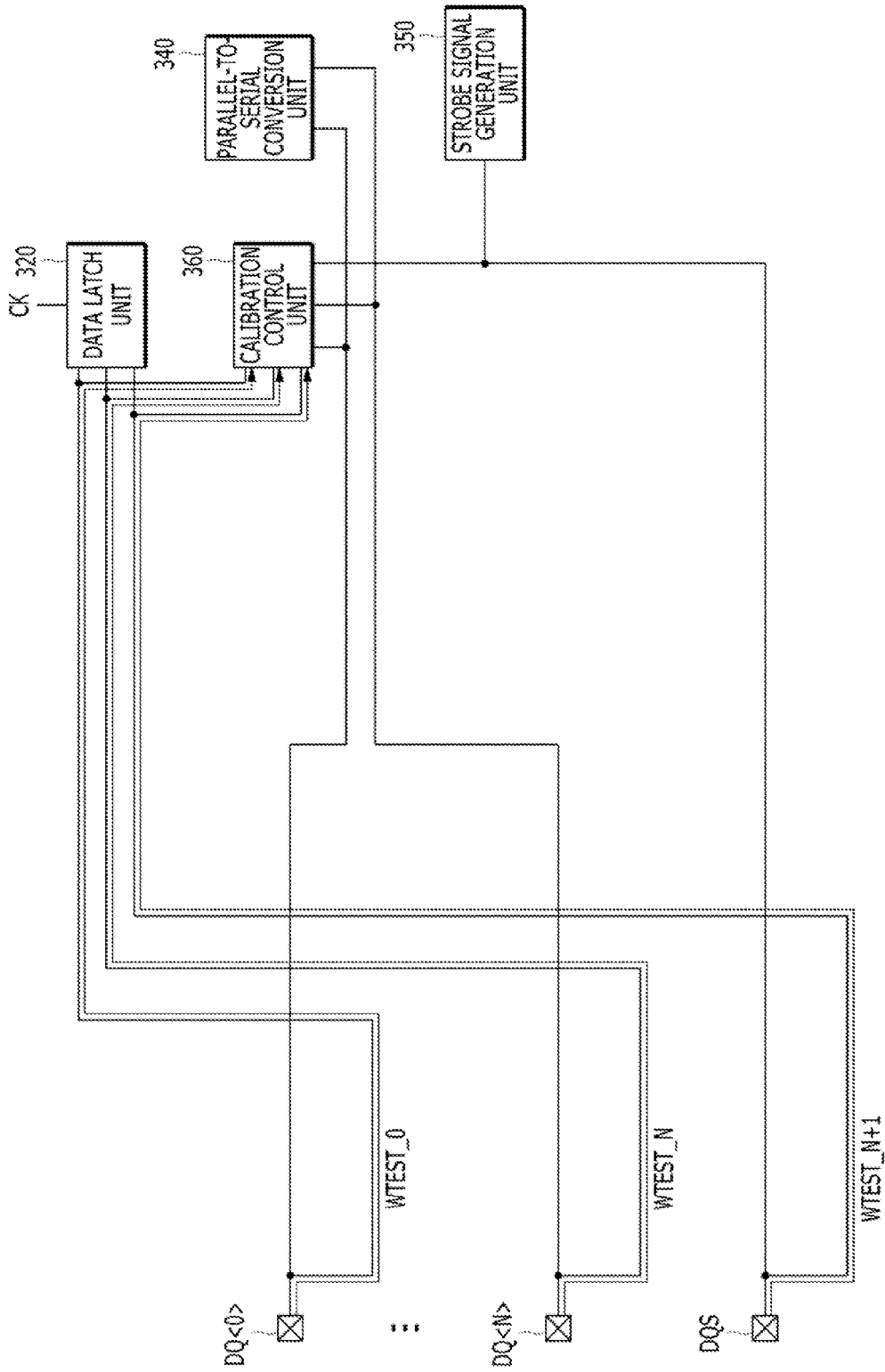
FIGS. 4A and 4B are diagrams for explaining a calibration operation of the semiconductor device of FIG. 3.
Figure 4B:
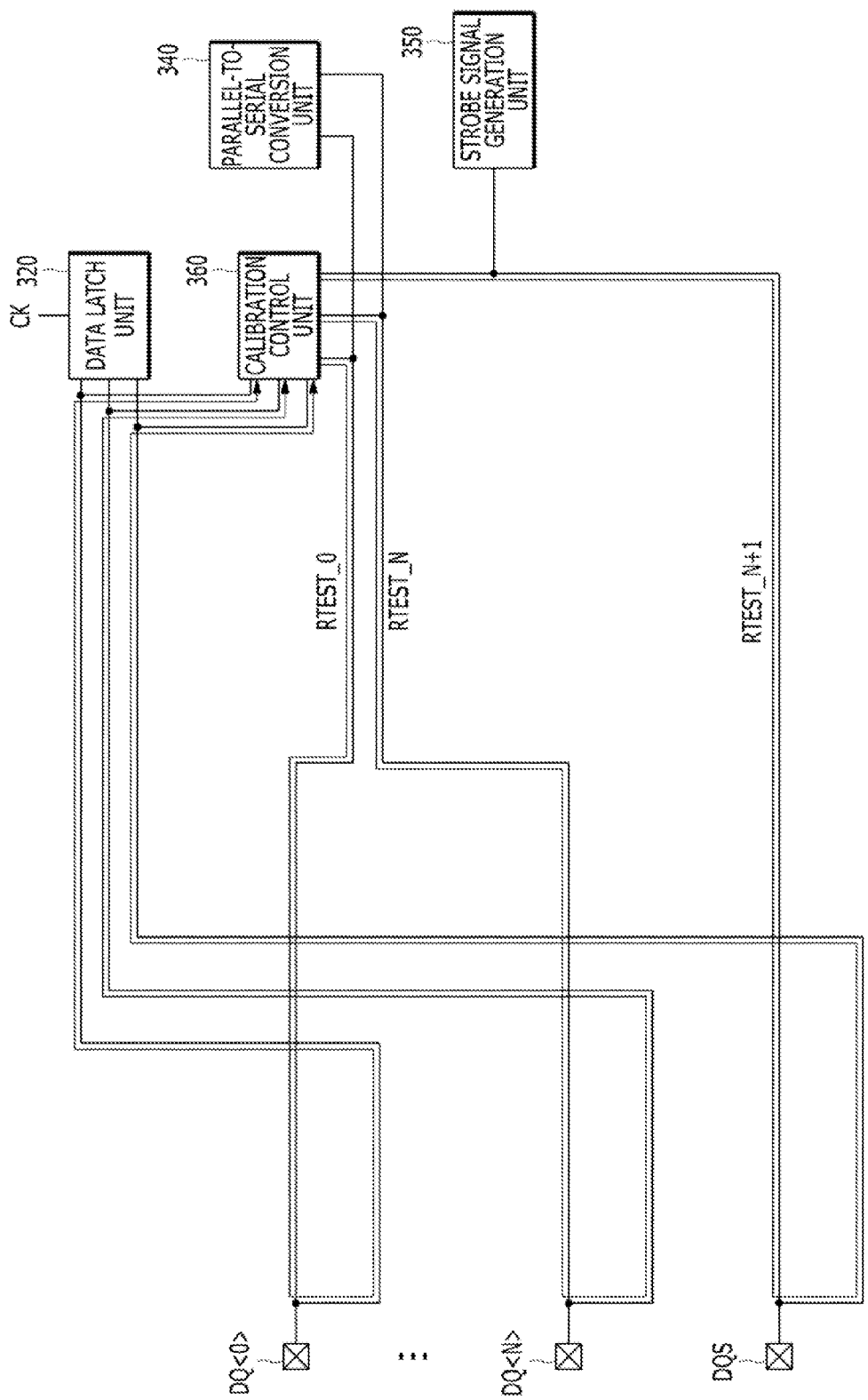

FIGS. 4A and 4B are diagrams for explaining the calibration operation of the semiconductor device of FIG. 3. In FIGS. 4A and 4B, only components required for describing the calibration operation are illustrated and the other components are omitted, for a simpler description.

FIG. 4A is a diagram for explaining the first calibration operation of the semiconductor device of FIG. 3.

When the first calibration signal CAL1_EN is activated, the semiconductor device may be set in the first calibration mode. In the first calibration mode, the clock CK may be inputted through the clock pad CK, and test signals WTEST_0 to WTEST_N+1 may be inputted through the plurality of data pads DQ<0:N> and the strobe signal pad DQS, respectively. Furthermore, in the first calibration mode, the write command WT may be periodically inputted to the semiconductor device. The calibration control unit 360 may generate the pieces of delay information WDEL0 to WDELN+1 corresponding to the respective write paths WP_DQ<0:N> and WP_DQS. Each piece of the delay information may have an initial value (for example, minimum value). For reference, the test signals WTEST_0 to WTEST_N+1 may include a periodic signal having the same form as the clock CK.

The test signals WTEST_0 to WTEST_N+1 inputted to the semiconductor device may pass through the respective write paths WP_DQ<0:N> and WP_DQS and may be inputted as input test signals TEST_I<0:N+1> to the calibration control unit 360. The calibration control unit 360 may compare the phases of the input test signals TEST_I<0:N+1> to the phase of the clock CK whenever the write command WT is inputted, and increase the delay information WDEL0 to WDELN+1. When the input test signals TEST_I<0:N+1> are in phase with the clock CK based on the phase comparison results, the calibration control unit 360 may store the corresponding delay information WDEL0 to WDELN+1. For example, when the test signal TEST_I<0> is in phase with the clock CK, the calibration control unit 360 may store the value of the delay information WDEL0, and when the test signal TEST_<K> is in phase with the clock CK, the calibration control unit 360 may store the value of the delay information WDELK. Due to a difference in the initial delay value between the paths, the pieces of delay information WDEL0 to WDELN+1 may have different values from each other.

When the values of the delay information WDEL0 to WDELN+1 reach the end value (for example, the maximum value), the first calibration signal CAL1_EN may be deactivated, and the first calibration mode of the semiconductor device may be completed When the first calibration mode of the semiconductor device is completed, the calibration control unit 360 may apply the stored delay information WDEL0 to WDELN+1 to the respective write paths WP_DQ<0:N> and WP_DQS. Thus, the write paths WP_DQ<0:N> and WP_DQS may have the calibrated delay values.

The test signals WTEST0 to WTEST_N+1 inputted to the plurality of data pads DQ<0:N> and the strobe signal pad DQS may have the same phase. Since the delay values of the write paths WP_DQ<0:N> and WP_DQS are calibrated to make the test signals WTEST_0 to WTEST_N+1 passing therethrough in phase with the clock CK, the write paths WP_DQ<0:N> and WP_DQS have the same delay value through the first calibration mode. On the other hand, the test signals WTEST0 to WTEST_N+1 may have different phases from each other. Although the test signals WTEST0 to WTEST_N+1 are generated in the same phase at a source (for example, test equipment or controller), the test signal WTEST0 to WTEST_N+1 inputted to the plurality of data pads DQ<0:N> and the strobe signal pad DQS may have different phases due to path differences between the pads and the source. The write paths WP_DQ<0:N> and WP_DQS may have different delay values from each other through the first calibration mode. In both cases, the signals passing through the write paths WP_DQ<0:N> and WP_DQS may have the same phase after the first calibration mode is completed. That is, all of the signals are in phase with the clock CK.

FIG. 4B is a diagram for explaining the second calibration operation of the semiconductor device of FIG. 3.

The second calibration operation may be performed after the first calibration operation is completed and the delay values of the write paths WP_DQ<0:N> and WP DQS are completely calibrated, When the second calibration signal CAL2_EN is activated, the semiconductor device may be set in the second calibration mode. In the second calibration mode, the clock CK may be inputted through the clock pad CK, and the calibration control unit 360 may generate a plurality of test signals RTEST_0 to RTEST_N+1. Furthermore, in the second calibration mode, the read command RD may be periodically inputted to the semiconductor device.

The calibration control unit 360 may generate pieces of delay information RDEL0 to RDELN+1 corresponding to the respective read paths RP_DQ<0:N> and RP_DQS. Each piece of the delay information RDEL0 to RDELN+1 may have an initial value (for example, minimum value). For reference, the test signals RTEST0 to RTEST_N+1 may include a periodic signal having the same form as the clock CK.

The test signals RTEST_0 to RTEST_N+1 generated through the calibration control unit 360 may pass through the respective read paths RP_DQ<0:N> and RP_DQS and the respective write paths WP_DQ<0:N> and WP_DQS, and then may be re-inputted as input test signals TEST_I<0:N+1> to the calibration control unit 360. The calibration control unit 360 may compare the phases of the input test signals TEST_I<0:N+1 to the phase of the clock CK whenever the read command RD is inputted, and increase the delay information RDEL0 to RDELN+1. When the input test signals TEST_I<0:N+1> are in phase with the dock CK based on the comparison results, the calibration control unit 360 may store the corresponding delay information RDEL0 to RDELN+1.

For example, when the test signal TEST_I<0> is in phase with the clock CK, the calibration control unit 360 may store the value of the delay information RDEL0, and when the test signal TEST_I<K> is in phase with the clock CK, the calibration control unit 360 may store the value of the delay information RDELK. Due to a difference in initial delay value between the paths, the pieces of delay information RDEL0 to RDELN+1 may have different values from each other.

When the values of the delay information RDEL0 to RDELN+1 reach the end value (for example, maximum value), the second calibration signal CAL2_EN may be deactivated, and the second calibration mode of the semiconductor device may be completed. When the second calibration mode of the semiconductor device is completed, the calibration control unit 360 may apply the stored delay information RDEL0 to RDELN+1 to the respective read paths RP_DQ<0:N> and RP_DQS. Thus, the read paths RP_DQ<0:N> and RP_DQS may have the calibrated delay values.

As described in the first calibration mode, the test signal's WTEST0 to WTEST_N+1 inputted to the plurality of data pads DQ<0:N> and the strobe signal pad DQS may have the same phase and the write paths WP_DQ<0:N> and WP_DQS may be calibrated to have the same delay value through the first calibration mode. At this time, when the test signals RTEST_0 to RTEST_N+1 generated from the calibration control unit 360 have the same phase, the read paths RP_DQ<0:N> and RP_DQS have the same delay value after the second calibration operation is completed. This is because the delay value of the read paths RP_DQ<0:N> and RP_DQS are calibrated to make the test signals RTEST_0 to RTEST_N+1 passing through the write paths WP_DQ<0:N> and WP_DQS and the read paths RP_DQ<0:N> and RP_DQS in phase with the clock CK. That is since the write paths WP_DQ<0:N> and WP_DQS have the same delay value after the first calibration operation is completed, the delay values of the read paths RP_DQ<0:N> and RP_DQS may be calibrated to the same delay value through the second calibration operation using the test signals passing through both the write paths and the read paths.

As described in the first calibration mode, the test signals WTEST0 to WTEST_N+1 inputted to the plurality of data pads DQ<0:N> and the strobe signal pad DQS may have different phases and the write paths WP_DQ<0:N> and WP_DQS may be calibrated to have different delay values through the first calibration mode. At this time, the delay values of the read paths RP_DQ<0:N> and RP_DQS may be calibrated by reflecting the different delay values of the write paths WP_DQ 0:N> and WP_DQS. That is, the delay values of the read paths RP_DQ<0:N> and RP_DQS are calibrated to make the test signals RTEST_0 to RTEST_N+1 passing therethrough have different phases as the test signals WTEST0 to WTEST_N+1. Thus, when the test signals RTES_0 to RTEST_N+1 are generated from the calibration control unit 360 in the same phase, the test signals RTEST_0 to RTEST_N+1 may have the same phase after passing through the read paths RP_DQ<0:N> and RP_DQS and the write paths WP_DQ<0:N> and WP_DQS. That is, the signals are in phase with the clock CK.

When the semiconductor device performs a write operation after all of the calibration operations are completed, the margin of the write operation may be optimized because the delay values of the write paths WP_DQ<0:N> and WP DQS are calibrated in such a manner that the data and the write strobe signal WDQS inputted to the data pads DQ<0:N> and the strobe signal pad DQS are in phase with each other at the data latch unit 320.

Furthermore, when the semiconductor device performs a read operation, the margin of the read operation may be optimized because the delay values of the read paths RP_DQ<0:N> and RP_DQS are calibrated in such a manner that the data outputted from the parallel-to-serial conversion unit 340 and the read strobe signal RDQS are in phase with each other at the corresponding pads DQ<0:N> and DQS.

The semiconductor device may arrange the strobe signal and the data inputted through the respective data pads on the basis of one signal referred to as the clock CK, and precisely adjust the phases of the data which are inputted to the respective data pads and pass through the corresponding write paths. Furthermore, the semiconductor device may precisely adjust the phases of the data which are inputted to the respective data pads and pass through the corresponding write paths to the phase of the strobe signal WDQS which is inputted to the strobe signal pad and passes through the strobe signal path. Furthermore, the semiconductor device may arrange the signals passing through the read paths and the write paths on the basis of the clock CK, in a state where the first calibration mode is completed and the delay values of the write paths are calibrated. Thus, the semiconductor device may precisely adjust the phases of the data which are outputted from the parallel-to-serial conversion unit 340 and pass through the corresponding read paths to the phase of the strobe signal RDQS which are outputted from the strobe signal generation unit 350 and passes through the strobe signal path.

In particular, when the delay values of the read paths are calibrated, the test signals RTEST_0 to RTEST_N+1 generated from the calibration control unit 360 may be re-inputted to the calibration control unit 360 to calibrate the delay values. Thus, a separate circuit may not be required outside the semiconductor device.

FIG. 5 is a diagram for explaining the process in which the calibration operation of the semiconductor device of FIG. 3 is performed. Hereafter, a case in which the semiconductor device includes four data pads DQ<0:3> and delay information WDEL0 to WDEL4 is a two-bit signal will be taken as an example. The delay information WDEL0 to WDEL4 may have a minimum value of 00 and a maximum value of 11, and the values of the delay information WDEL0 to WDEL4 are proportional to the delay values of the corresponding variable delay units VD.

When the semiconductor device enters the first calibration mode, the delay information WDEL0 to WDEL4 corresponding to the respective write paths WP_DQ<0:3> and WP_DQS are set to the initial value (for example, the minimum value of '00'). When the values of the delay information WDEL0 to WDEL4 periodically increase and approach the end value (for example, the maximum value of '11') the first calibration operation is completed.

When the delay information WDEL0 to WDEL4 having the initial value is applied to the respective write paths WP_DQ<0:3> and WP_DQS the delay values of the variable delay units VD of the respective write paths WP_DQ<0:3> and WP_DQS may be calibrated to the minimum value (510). The calibration control unit 360 may compare the phases of input test signals TEST_I<0:4> inputted to the calibration control unit 360 through the respective write paths WP_DQ<0:3> and WP_DQS to the phase of the clock CK in a state where the delay values of the variable delay units VD are set to the minimum value.

When the delay information WDEL0 to WDEL4 is changed to '01' (520), the delay values of the variable delay units VD of the respective write paths WP_DQ<0:3> and WP_DQS may be increased by the unit value. The calibration control unit 360 may compare the phases of the input test signals TEST_I<0:4> to the phase of the clock CK. At this time, when the test signals TEST_I<0> and TEST_I<4> in phase with the clock CK are detected, the value of '01' may be stored in the corresponding pieces of delay information WDEL0 and WDEL4.

Similarly, when the test signals in phase with the clock CK are detected while the values of the delay information WDEL0 to WDEL4 are changed to 10 (530) and 11 (540), the values of '10' and '11' may be stored in the corresponding delay information. FIG. 5 illustrates the case in which the value of '10' is stored in the delay information WDEL1 and WDEL2 and the value of '11' is stored in the delay information WDEL3. When the first calibration operation is completed, the stored delay information WDEL0 to WDEL4 may be applied to the corresponding variable delay units VD, and the delay values of the write paths WP_DQ<0:3> and WP_DQS may be calibrated to the same value.

In the case of the second calibration operation, the test signals TEST_I<0:4> may correspond to the signals which have sequentially passed through the respective read paths RP_DQ<0:3> and RP_DQS and the respective write paths WP_DQ<0:3> and WP_DQS, and the calibrated delay information RDEL0 to RDEL4 may correspond to the variable delay units VD included in the respective read paths RP_DQ<0:3> and RP_DQS. The process in which the delay information RDEL0 to RDEL4 is calibrated and stored may be performed in the same manner as the first calibration operation.

Figure 6:
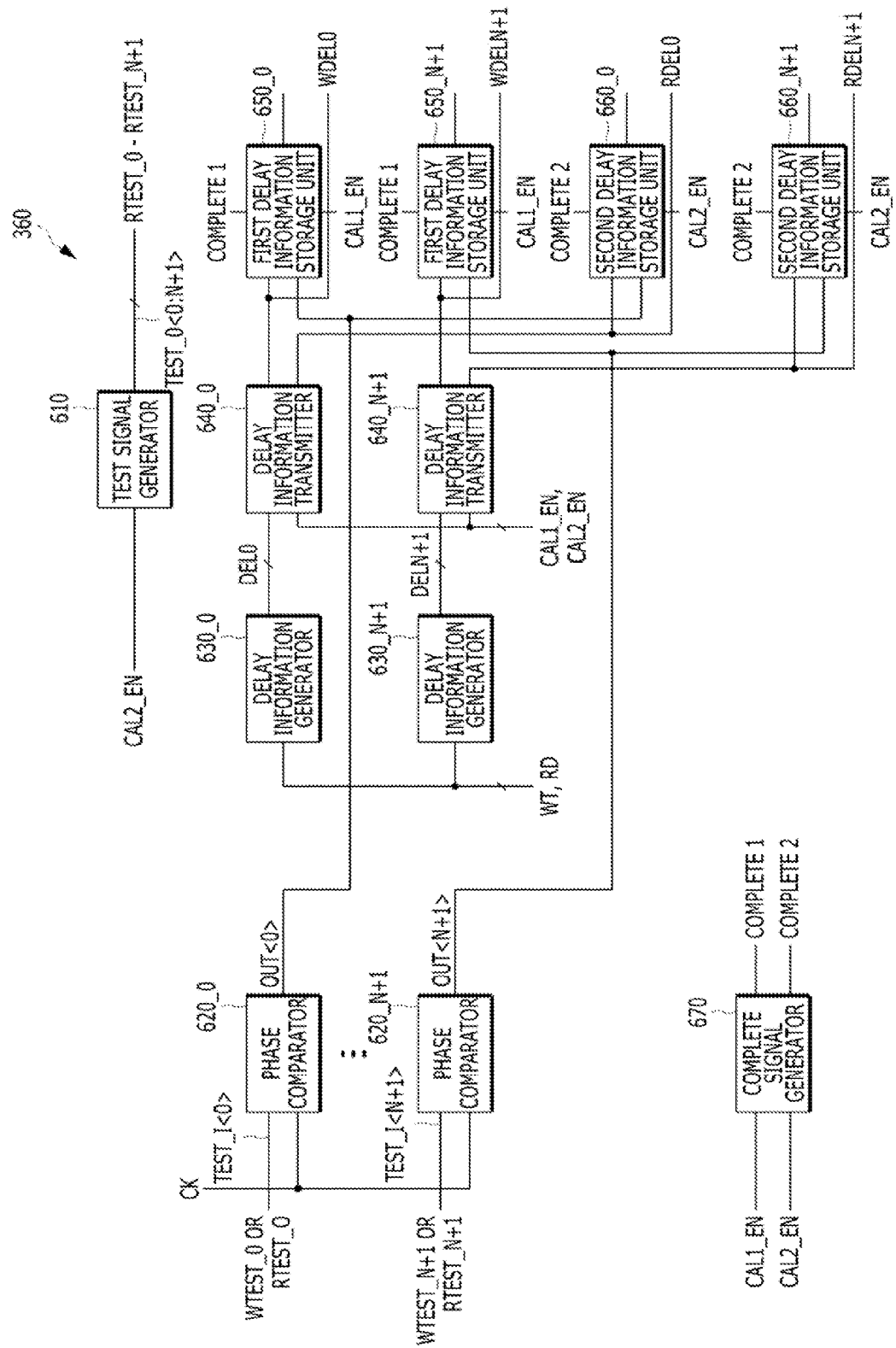
FIG. 6 is a configuration diagram of a calibration control unit 360.

FIG. 6 is a configuration diagram of the calibration control unit 360.

As illustrated in FIG. 6, the calibration control unit 360 may include a test signal generator 610, a plurality of phase comparators 620_0 to 620_N+1, a plurality of delay information generators 630_0 to 630 N+1, a plurality of delay information transmitters 640_0 to 640_N+1, a plurality of first delay information storage units 650_0 to 650_N+1, a plurality of second delay information storage units 660_0 to 660_N+1, and a complete signal generator 670.

Referring to FIGS. 3 to 6, the calibration control unit 60 will be described.

When the second calibration signal CAL2_EN is activated, the test signal generator 610 may generate a plurality of test signals RTEST_0 to RTEST_N+1 and output the generated test signals. The test signals RTEST_0 to RTEST_N+1 may pass through the corresponding read paths RP_DQ<0:N> and RP_DQS and the corresponding write paths WP_DQ<0:N> and WP_DQS and then may be re-inputted as test signals TEST_I<0:N+1> to the calibration control unit 360.

The plurality of phase comparators 620_0 to 620_N+1 may compare the phases of the respective test signals TEST_I<0:N+1> inputted to the calibration control unit 330, to the phase of the clock CK and output the comparison results OUT<0:N+1>. For example, each of the phase comparators 620_0 to 620_N+1 may be implemented with a circuit which detects the logical value of a test signal corresponding to a rising edge of the clock CK. In this case, when the detected logical value of the test signal transits from a high level to a low level, it may indicate that the test signal and the clock CK are in phase with each other. On the other hand, each of the phase comparators 620_0 to 620_N+1 may be implemented with a circuit which detects the logical value of the clock CK at a rising edge of the corresponding test signal. In this case, when the detected logical value of the clock CK transits from the low level to the high level, it may indicate that the test signal and the clock CK are in phase with each other.

When the first or second calibration signal CAL1_EN or CAL2_EN is activated, the plurality of delay information generators 630_0 to 630_N+1 may generate delay information DEL0 to DELN+1, and change (increase) the values of the delay information DEL0 to DELN+1 whenever the write command WT or the read command RD is activated. The plurality of delay information generators 630_0 to 630_N+1 may set the delay information DEL0 to DELN+1 to the initial value when the value of the corresponding delay information DEL0 to DELN+1 reaches the end value.

The plurality of delay information transmitters 640_0 to 640_N+1 may transmit the delay information DEL0 to DELN+1 as write delay information WDEL0 to WDELN+1 when the first calibration signal CAL1_EN is activated, and transmit the delay information DEL0 to DELN+1 as read delay information RDEL0 to RDELN+1 when the second calibration signal CAL2_EN is activated.

The plurality of first delay information storage units 650_0 to 650_N+1 may store the corresponding write delay information WDEL0 to WDELN+1 in response to the comparison results of the corresponding phase comparators 620_0 to 620_N+1. In particular, when the test signals are in phase with the clock CK based on the comparison results of the phase comparators 620_0 to 620_N+1, the first delay information storage units 650_0 to 650_N+1 may store the corresponding write delay information WDEL0 to WDELN+1. Furthermore, when a first complete signal COMPLETE1 is activated, the first delay information storage units 650_0 to 650_N+1 may output the stored write delay information WDEL0 to WDELN+1.

When the second calibration signal CAL2_EN is activated, the second delay information storage units 660_0 to 660_N+1 may store the corresponding read delay information RDEL0 to RDELN+1 in response to the comparison results of the corresponding phase comparators 620_0 to 620_N+1. In particular, when the test signals are in phase with the clock CK based on the comparison results of the phase comparators 620_0 to 620_N+1, the second delay information storage units 660_0 to 660_N+1 may store the corresponding read delay information RDEL0 to RDELN+1. Furthermore, when a second complete signal COMPLETE2 is activated, the second delay information storage units 660_0 to 660_N+1 may output the stored read delay information RDEL0 to RDELN+1.

The complete signal generator 670 may activate the first complete signal COMPLETE1 when the first calibration signal CAL1_EN is activated and then deactivated, and activate the second complete signal COMPLETE2 when the second calibration signal CAL2_EN is activated and then deactivated.

FIG. 6 illustrates the case in which the calibration control unit 360 stores and outputs the delay information WDEL0 to WDELN+1 and RDEL0 to RDELN+1 after the calibration is completed. Depending on circuit design however, the calibration control unit 360 may detect and output the values of the delay information WDEL0 to WDELN+1 and RDEL0 to RDELN+1 through which the phases of the clock CK and the input test signals TEST_I<0:N+1> are equalized to each other, and the output delay information WDEL0 to WDELN+1 and RDEL0 to RDELN+1 may be stored in a separate storage circuit of the semiconductor device. The storage circuit may include an E-fuse array, or various nonvolatile memories such as flash memory and EEPROM.

Referring to FIGS. 3 to 5, semiconductor device in accordance with another embodiment of the present invention will be described.

The semiconductor device may include a write control unit including a data latch unit 320 and a serial-to-parallel conversion unit 330 and a read control unit including a parallel-to-serial conversion unit 340 and a strobe signal generation unit 350.

As described above with reference to FIG. 3, signals pass from the plurality of data pads DQ<0:N> and the strobe signal pad DQS to the write control unit 320 and 330, through the write paths WP_DQ<0:N> and WP_DQS having different delay values. In the first calibration mode, the semiconductor device may calibrate the delay values of the write paths WP_DQ<0:N> and WP_DQS to the same value.

Furthermore, signals pass from the read control unit 340 and 350 to the plurality of data pads DQ<0:N> and the strobe signal pad DQS, through the read paths RP_DQ<0:N> and RP_DQS having different delay values. In the second calibration mode, the semiconductor device may calibrate the delay values of the read paths RP_DQ<0:N> and RP_DQS to the same value.

The semiconductor device may calibrate the delay values of the read paths RP_DQ<0:N> and RP_DQS using phase comparison results between the clock CK and the test signals RTEST_0 to RTEST_N+1 passing through the write paths WP_DQ<0:N> and WP_DQS and the read paths RP_DQ<0:N> and RP_DQS, in the second calibration mode.

The semiconductor device may calibrate the delay values of the write paths WP_DQ<0:N> and WP_DQS to the same value, and calibrate the delay values of the read paths RP_DQ<0:N> and RP_DQS to the same value, thereby maximizing the margin of data during the write or read operation. Furthermore, the delay values of the read paths RP DQ<0:N> and RP_DQS may also be calibrated inside the semiconductor device.

Figure 7:
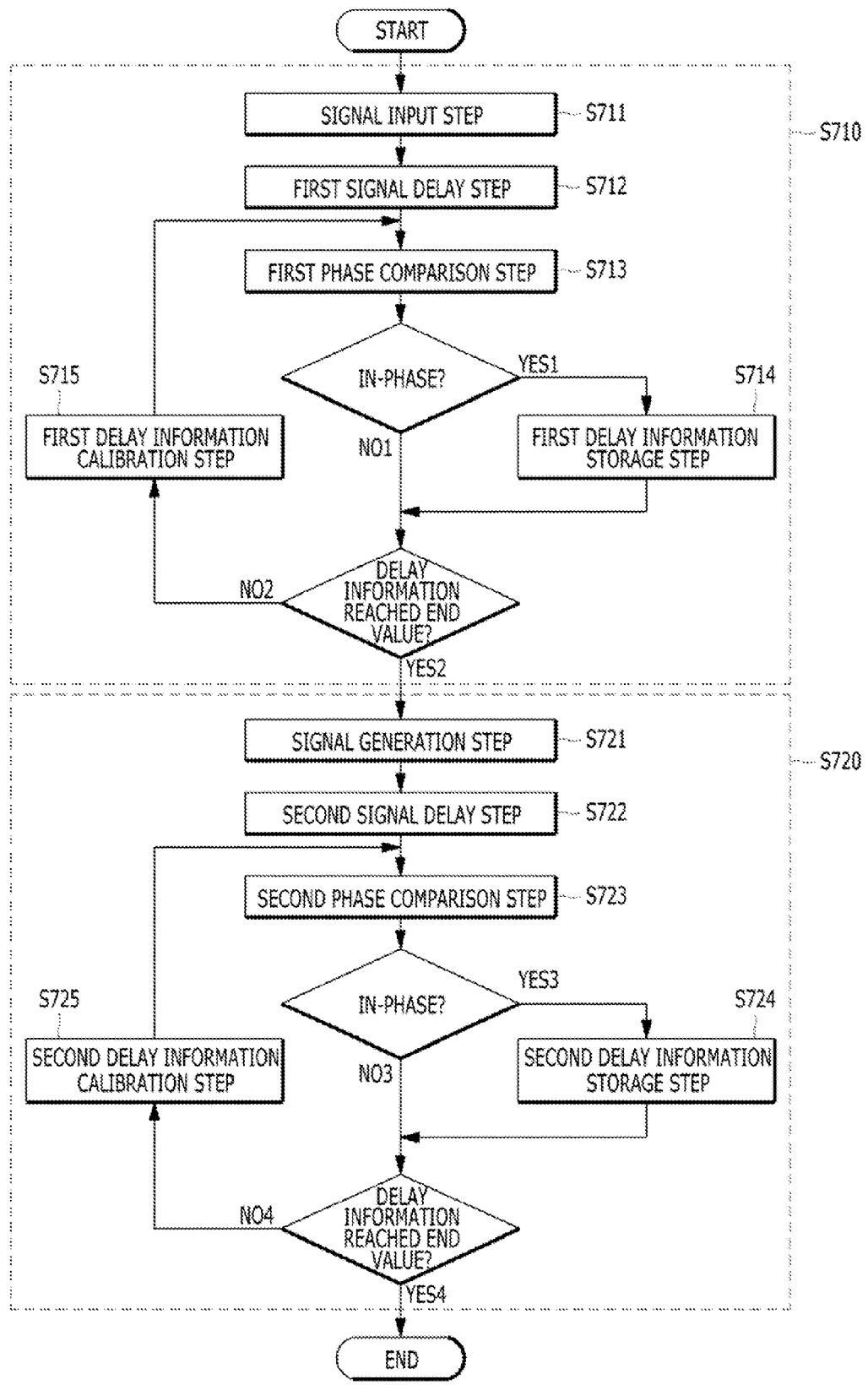
FIG. 7 is a flowchart for explaining a method for operating the semiconductor device of FIG. 3.

FIG. 7 is a flowchart for explaining a method for operating the semiconductor device of FIG. 3.

The method for operating the semiconductor device may include a first calibration step S710 and a second calibration step S720. Hereafter, referring to FIGS. 3 to 7 the method for operating the semiconductor device will be described.

When the first calibration step S710 starts, the semiconductor device may receive a clock CK through the clock pad CK, and receive a plurality of input write test signals WTEST_0 to WTEST_N+1 through the plurality of data pads DQ<0:N> and the strobe signal pad DQS (referred to as a signal input step S711). The input write test signals WTEST_0 to WTEST_N+1 may be inputted to the calibration control unit 360 through the respective write paths WP_DQ<0:N> and WP_DQS (referred to as a first signal delay step S712).

The calibration control unit 360 may compare the phases of the input write test signals WTEST_0 to WTEST_N+1 to the phase of the clock CK (referred to as a first phase comparison step S713). Based on the phase comparison results of the phase comparison step S713, when the input write test signals WTEST_0 to WTEST_N+1 are in phase with the clock CK (YES1), the corresponding delay information WDEL0 to WDELN+1 may be stored (referred to as a first delay information storage step S714). When the input write test signals WTEST_0 to WTEST_N+1 are out of phase with the clock CK (NO1), the following step may proceed without storing the delay information WDEL0 to WDELN+1.

When the values of the delay information WDEL0 to WDELN+1 do not reach the end value (NO2), the values of the delay information WDEL0 to WDLEN+1 may be calibrated, and the delay values of the corresponding write paths WP_DQ<0:N> and WP_DQS may be calibrated (referred to as a first delay information calibration step S715). When the values of the delay information WDEL0 to WDELN+1 reach the end value (YES2), the first calibration step S710 may end, and the semiconductor device may enter the second calibration step S720. For reference, the first phase comparison step S713 and the first delay information calibration step S715 may be performed in response to the write command WT which is periodically inputted to the semiconductor device.

When the second calibration step S720 starts, the semiconductor device may receive the dock CK through the dock pad CK, and generate a plurality of read test signals RTEST_0 to RTEST_N+1 (referred to as a signal generation step S721). The generated read test signals RTEST0 to RTEST_N+1 may pass through the respective read paths RP_DQ<0:N> and RP_DQS and the respective write paths WP_DQ<0:N> and WP_DQS and then may be inputted to the calibration control unit 360 (referred to as a second signal delay step S722).

The calibration control unit 360 may compare the phases of the inputted read test signals RTEST0 to RTEST_N+1 to the phase of the clock CK (referred to as a second phase comparison step S723). Based on the phase comparison results of the second phase comparison step S723, when the inputted read test signals RTEST_0 to RTEST_N+1 are in phase with the clock CK (YES3), the calibration control unit 360 may store the corresponding delay information RDEL0 to RDELN+1 (referred to as a second delay information storage step S724). When the inputted read test signals RTESL0 to RTEST_N+1 are out of phase with the clock CK (NO3), the following step may proceed without storing the delay information RDEL0 to RDELN+1.

When the values of the delay information RDEL0 to RDELN+1 do not reach the end value (NO4), the values of the delay information RDEL0 to RDELN+1 may be calibrated, and the delay values of the corresponding read paths RP_DQ<0:N> and RP_DQS may be calibrated (referred to as a second delay information calibration step S725). When the values of the delay information RDEL0 to RDELN+1 reach the end value (YES4), the second calibration step S720 may end. For reference, the second phase comparison step S723 and the second delay information calibration step S725 may be performed in response to the read command RD which is periodically inputted to the semiconductor device.

In the above-described embodiment, signals inputted to the data pads ©Q<0:N> and the strobe signal pad DQS may reach the data latch unit 320 and the calibration control unit 360 through substantially the same path. Furthermore, signals outputted from the parallel-to-serial conversion unit 340 and the strobe signal generation unit 350 may reach the data pads DQ<0:N> and the strobe pad DQS through substantially the same path as the signals outputted from the calibration control unit 360. Thus, based on the phase comparison results between the clock CK and the test signals inputted to the calibration control unit 360, the delay values of the write paths WP_DQ<0:N> and WP_DQS and the read paths RP_DQ<0:N> and RP_DQS may be precisely calibrated.

In accordance with the embodiments of the present invention, the phases of signals passing through the input/output paths of the semiconductor device may be compared to the phase of the reference signal. Based on the comparison results, the delay values of the input/output paths may be calibrated to more precisely adjust the phases of the respective signals passing through the input/output paths, thereby increasing the margin for inputting/outputting the signals.

Furthermore, the delay values of the input paths for various signals may be first calibrated, and signals may pass through the output paths and the input paths of which the delay values are calibrated, in order to compare the phase of the signals. Thus, the delay values of the output paths may be more precisely calibrated inside the semiconductor device.

Although various embodiments have been described for illustrative purposes, it will be apparent to those skilled in the art that various changes and modifications may be made without departing from the spirit and scope of the invention as defined in the following claims.

What is claimed is:
1. A semiconductor device comprising:
a first pad suitable for inputting a clock;
a plurality of second pads suitable for inputting data through a plurality of first data paths;
a third pad suitable for inputting a first strobe signal through a first strobe signal path;
a data latch unit suitable for latching the data inputted through the first data paths in response to the first strobe signal inputted through the first strobe signal path;
a calibration control unit suitable for calibrating delay values of the plurality of first data paths and the first strobe signal path in a first calibration mode such that a plurality of first test signals passing through the respective first data paths and a second test signal passing through the first strobe path are in phase with the clock inputted from the first pad;
an internal circuit suitable for storing inputted data and outputting stored data;
a serial-to-parallel conversion unit suitable for serial-to-parallel converting data outputted from the data latch unit in response to the clock;
a parallel-to-serial conversion unit suitable for parallel-to-serial converting data outputted from the internal circuit in response to an internal clock;
a strobe signal generation unit suitable for generating a second strobe signal in response to the internal clock; and
a plurality of global lines suitable for transmitting data outputted from the serial-to-parallel conversion unit to the internal circuit or transmitting the data outputted from the internal circuit to the parallel-to-serial conversion unit.

2. The semiconductor device of claim 1, wherein the plurality of second pads outputs data received from the parallel-to-serial conversion unit through a plurality of second data paths, and the third pad outputs the second strobe signal received from the strobe signal generation unit through a second strobe signal path.

3. The semiconductor device of claim 2, wherein the calibration control unit performs a second calibration mode after the first calibration mode is completed, and calibrates delay values of the plurality of second data paths and the second strobe signal path in the second calibration mode such that a plurality of third test signals, sequentially passing through the respective second data paths and the respective first data paths, and a fourth test signal, sequentially passing through the second strobe path and the first strobe signal, are in phase with the clock.

4. The semiconductor device of claim 3, wherein during a write operation, the data inputted to the plurality of second pads are inputted to the data latch unit through the respective first data paths, and the first strobe signal inputted to the third pad is inputted to the data latch unit through the first strobe signal path, and
during a read operation, the data outputted from the parallel-to-serial conversion unit are transmitted to the plurality of second pads through the respective second data paths and outputted to the outside, and the second strobe signal is transmitted to the third pad through the second strobe signal path and outputted to the outside.

5. The semiconductor device of claim 4, wherein the calibration control unit comprises:
- a test signal generator suitable for generating a plurality of test signals in the second calibration mode;
- a plurality of phase comparators suitable for comparing the phases of respective input test signals to the phase of the clock;
- a plurality of delay information generators suitable for generating pieces of delay information for calibrating delay values of the first and second data paths and the first and second strobe signal paths, and calibrating the values of the pieces of the delay information based on the phase comparison results of the respective phase comparators; and
- a plurality of delay information storage units suitable for storing the pieces of delay information, respectively, when the respective input test signals are in phase with the clock.

6. The semiconductor device of claim 5, wherein the calibration control unit outputs the pieces of delay information stored therein, when the first and second calibration modes are completed.

7. The semiconductor device of claim 5, wherein, in the first calibration mode, the phases of the first test signals and the second test signal are compared to the phase of the clock in response to a write command which is periodically inputted from outside, and the values of the pieces of delay information are calibrated based on the comparison results.

8. The semiconductor device of claim 5, wherein in the second calibration mode, the phases of the third test signals and the fourth test signal are compared to the phase of the clock in response to a read command which is periodically inputted from outside, and the values of the pieces of delay information are calibrated based on the comparison results.

9. The semiconductor device of claim 2, wherein the plurality of first data paths and the first strobe signal path have different lengths, and the plurality of second data paths and the second strobe signal path have different lengths.

10. A semiconductor device comprising:
- a clock pad suitable for inputting a clock;
- a plurality of data pads suitable for inputting/outputting data;
- a strobe signal pad suitable for inputting/outputting a strobe signal;
- an internal circuit suitable for storing inputted data during a write operation and outputting stored data during a read operation;
- a write control unit suitable for latching data inputted to the plurality of data pads in response to a first strobe signal inputted to the strobe signal pad, serial-to-parallel converting latched data in response to the clock inputted to the clock pad, and transmitting converted data to the internal circuit as the inputted data, during the write operation;
- a read control unit suitable for parallel-to-serial converting the stored data outputted from the internal circuit in response to an internal clock, outputting converted data to the outside through the plurality of data pads, generating a second strobe signal, and outputting the second strobe signal to the outside through the strobe signal pad, during the read operation; and
- a calibration control unit suitable for calibrating delay values of write paths between the plurality of data pads and the strobe signal pad and the write control unit to have the same delay value in a first calibration mode, and calibrating delay values of read paths between the read control unit and the plurality of data pads and the strobe signal pad to have the same delay value in a second calibration mode.

11. The semiconductor device of claim 10, wherein the calibration control unit compares the phases of write test signals passing through the respective write paths to the phase of the clock, and calibrates the delay values of the write paths based on the comparison results, in the first calibration mode.

12. The semiconductor device of claim 11, wherein the calibration control unit performs the second calibration mode after the first calibration mode is completed, compares the phases of read test signals sequentially passing through the respective read paths and the respective write paths to the phase of the clock by generating the read test signals, and calibrates the delay values of the read paths based on the comparison results, in the second calibration mode.

13. The semiconductor device of claim 12, wherein the calibration control unit stores pieces of write delay information corresponding to calibrated delay values of the write paths when the first calibration mode is completed, stores pieces of read delay information corresponding to calibrated delay values of the read paths when the second calibration mode is completed, and applies the pieces of stored write delay information to the corresponding write paths and the pieces of stored read delay information to the corresponding read paths when the first and second calibration modes are completed.

14. The semiconductor device of claim 12, wherein, in the first calibration mode, the calibration control unit compares the phases of the write test signals to the phase of the clock in response to a write command which is periodically inputted, and calibrates the delay values of the write paths, and
- in the second calibration mode, the calibration control unit compares the phases of the read test signals to the phase of the clock in response to a read command which is periodically inputted, and calibrates the delay values of the read paths.

15. A method for operating a semiconductor device, comprising: receiving a clock through a clock pad and receiving a plurality of write test signals through a plurality of data pads and a strobe signal pad;
- passing the plurality of write test signals through a plurality of write paths, respectively;
- comparing the phases of the write test signals passing through the respective write paths to the phase of the clock; and
- calibrating delay values of the write paths;
- wherein the plurality of write paths comprise paths between the plurality of data pads or the strobe signal pad and a data latch unit which latches data inputted to the plurality of data pads in response to a first strobe signal inputted to the strobe signal pad;
- generating a plurality of read test signals;
- outputting the plurality of read test signals through a plurality of read paths, respectively;
- inputting the read test signals, outputted through the respective read paths, through the respective write paths;
- comparing the phases of the read test signals outputted and inputted to the phase of the clock; and
- adjusting delay values of the read paths.

16. The method of claim 15, wherein the comparing of the phases of the write test signals to the phase of the clock and the calibrating of the delay values of the write paths are performed in response to a write command which is periodically inputted.

17. The method of claim 16, further comprising:
storing plural pieces of write delay information corresponding to calibrated delay values of the write paths when the write test signals passing through the respective write paths are in phase with the clock.

18. The method of claim 15, wherein the comparing of the phases of the read test signals to the phase of the clock and the calibrating of the delay values of the read paths are performed in response to a read command which is periodically inputted.

19. The method of claim 18, further comprising:
storing pieces of read delay information corresponding to calibrated delay values of the read paths when the read test signals inputted and outputted are in phase with the clock.

20. The method of claim 15, wherein the plurality of read paths comprise paths between the plurality of data pads and a parallel-to-serial conversion unit which parallel-to-serial converts input data in response to an internal clock or a path between the strobe signal pad and a strobe signal generation unit which generates a second strobe signal in response to the internal clock.

\* \* \* \* \*